(12) United States Patent
Roche et al.

(10) Patent No.: US 11,740,278 B2
(45) Date of Patent: Aug. 29, 2023

(54) ELECTRONIC TEST EQUIPMENT APPARATUS AND METHODS OF OPERATING THEREOF

(71) Applicant: Infineon Technologies AG, Neubiberg (DE)

(72) Inventors: Kevin Roche, Lowell, MA (US); Alfonso Diy, El Segundo, CA (US); Emanuel-Petre Eni, Neubiberg (DE); Josef Niedermeyr, Egling (DE); Efren Tarlac, Carson, CA (US)

(73) Assignee: Infineon Technologies AG, Neubiberg (DE)

( * ) Notice: Subject to any disclaimer, the term of this patent is extended or adjusted under 35 U.S.C. 154(b) by 546 days.

(21) Appl. No.: 16/529,940

(22) Filed: Aug. 2, 2019

(65) Prior Publication Data
US 2021/0033659 A1 Feb. 4, 2021

(51) Int. Cl.
*G01R 31/26* (2020.01)
*G01R 1/36* (2006.01)
*G01R 31/28* (2006.01)
*G01R 31/319* (2006.01)

(52) U.S. Cl.
CPC ........... *G01R 31/2639* (2013.01); *G01R 1/36* (2013.01); *G01R 31/2893* (2013.01); *G01R 31/31912* (2013.01)

(58) Field of Classification Search
CPC .. G01R 31/2639; G01R 31/2893; G01R 1/36; G01R 31/31912
See application file for complete search history.

(56) References Cited

U.S. PATENT DOCUMENTS

| | | | | |
|---|---|---|---|---|
| 5,243,274 A | * | 9/1993 | Kelsey | G01R 31/31935 714/724 |
| 5,581,432 A | * | 12/1996 | Welinitz | H03K 17/0822 324/523 |
| 7,295,021 B2 | * | 11/2007 | Gaggl | G01R 1/36 324/754.07 |
| 8,760,180 B1 | * | 6/2014 | King | G01R 31/2879 324/750.02 |
| 2011/0248702 A1 | * | 10/2011 | Kume | G01R 19/0092 324/119 |
| 2013/0027825 A1 | * | 1/2013 | Keller | G01R 31/2879 361/56 |

(Continued)

*Primary Examiner* — Akm Zakaria
(74) *Attorney, Agent, or Firm* — Murphy, Bilak & Homiller, PLLC

(57) ABSTRACT

An electronic test equipment apparatus includes a power terminal configured to receive power, an interface for a device under test (DUT), at least one power transistor connected in series between the power terminal and the interface for the DUT, and a protection circuit. The protection circuit is configured to: switch on the at least one power transistor, to electrically connect the power terminal to the DUT through the interface as part of a test routine; and subsequently automatically switch off the at least one power transistor after a predetermined delay, to electrically disconnect the power terminal from the DUT regardless of whether the DUT passes or fails the test routine. A voltage clamp circuit for electronic test equipment and corresponding methods of testing devices using such electronic test equipment are also described.

20 Claims, 8 Drawing Sheets

(56) References Cited

U.S. PATENT DOCUMENTS

| | | | |
|---|---|---|---|
| 2014/0070831 A1* | 3/2014 | Kushnick | G01R 1/36 |
| | | | 324/754.07 |
| 2017/0254842 A1* | 9/2017 | Bahl | G01R 19/0084 |
| 2018/0063918 A1* | 3/2018 | Nakamura | B60Q 1/0094 |
| 2019/0005174 A1* | 1/2019 | Farag | G06F 30/331 |

* cited by examiner

ELECTRONIC TEST EQUIPMENT APPARATUS AND METHODS OF OPERATING THEREOF

BACKGROUND

Conventional dynamic test methodologies for power semiconductor devices such as power MOSFETs (metal-oxide semiconductor field-effect transistors), IGBTs (insulated gate bipolar transistors), HEMTs (high electron mobility transistors), SiC FETs, power diodes, etc. include an inductive load test where an inductive load is simulated by energizing an inductor and then disconnecting the inductor from the energy source to determine whether a device-under-test (DUT) can handle energy released from the inductor. In the case of a clamped inductive load test, the voltage applied to the DUT during testing is clamped to protect the DUT if the DUT does not include a clamping diode and to protect the test equipment. Clamped inductive load testing also provides a dissipation path for the energy stored in the inductor after the test is complete. The interface hardware for implementing the clamped inductive load test includes a prober interface board for a dynamic wafer test cell and delivers the necessary energy to the DUT for exciting defects while not damaging good devices or the test hardware.

One challenge with such a dynamic test is how to quickly divert the energy of the high current clamped inductive load test when a device fails, after dynamic switching with high currents and high voltages. If the energy of the high current clamped inductive load test is not quickly diverted, the energy can cause holes in the wafer being tested, damage good dies (chips) and damage the test hardware, e.g. the wafer chuck and probe needles.

Conventional energy diversion techniques for the clamped inductive load test include a parallel crowbar circuit which bypasses some of the current that flows through the DUT when the parallel crowbar circuit shorts. However, some current still flows through the DUT and can be large enough to cause damage. Also, there is a delay, typically several microseconds, before the parallel crowbar circuit becomes active. Conventional wafer probe current limiters are implemented by MOSFETs that are biased into a linear region when an overcurrent condition occurs. However, such MOSFET-based wafer probe current limiters have a relatively slow reaction time and generate a large amount of heat.3

Thus, there is a need for improved energy diversion and wafer probe current limiting techniques for dynamic test methodologies for power semiconductor devices.

SUMMARY

According to an embodiment of an electronic test equipment apparatus, the electronic test equipment apparatus comprises: a power terminal configured to receive power; an interface for a device under test (DUT); at least one power transistor connected in series between the power terminal and the interface for the DUT; and a protection circuit configured to: switch on the at least one power transistor, to electrically connect the power terminal to the DUT through the interface as part of a test routine; and subsequently automatically switch off the at least one power transistor after a predetermined delay, to electrically disconnect the power terminal from the DUT regardless of whether the DUT passes or fails the test routine.

According to an embodiment of a voltage clamp circuit for electronic test equipment, the voltage clamp circuit comprises: a plurality of branches of series-connected linear power MOSFETs, each linear power MOSFET of the plurality of linear power MOSFETs having a linear or nearly linear relationship between gate voltage and drain-source on resistance; and a circuit configured to control which linear power MOSFETs of the plurality of linear power MOSFETs are on and which linear power MOSFET of the plurality of linear power MOSFETs are off, to provide continuous or near continuous adjustments to a voltage limited by the voltage clamp circuit.

According to an embodiment of a method of testing a device under test (DUT), the method comprises: probing the DUT via a DUT interface, the DUT interface being electrically connectable to an energy source through at least one power transistor connected in series between the energy source and the DUT interface; switching on the at least one power transistor, to electrically connect the energy source to the DUT through the DUT interface as part of a test routine; and subsequently automatically switching off the at least one power transistor after a predetermined delay, to electrically disconnect the energy source from the DUT regardless of whether the DUT passes or fails the test routine.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein is an energy diversion technique with a shut-off at fixed time delay, for dynamic test methodologies such as clamped inductive load testing. The energy diversion technique effects good and bad devices the same way. The energy diversion technique described herein may be beneficial for clamped inductive load testing of IGBTs and other types of power semiconductor devices such as SiC (silicon carbide) FETs, power MOSFETs, power diodes, etc. In general, the energy diversion technique described herein may be used for dynamic testing of any type of high-voltage transistor or diode in the power path of test equipment. In the case of clamped inductive load testing, an energy diversion circuit is provided between a DUT and an inductor charged by a power supply. The energy diversion circuit is programmed with a predetermined turn off time independent of any feedback/monitoring, and automatically switches off the DUT after the predetermined delay to electrically disconnect charge inductor from the DUT regardless of whether the DUT passes or fails the test routine.

Also described herein is a voltage clamping technique which may be used in conjunction with, or independently of, the energy diversion technique. The voltage clamping technique has a continuously variable or nearly continuously variable voltage clamping behaviour and is implemented using linear MOSFETs which have a linear relationship between gate voltage and Rdson (drain-source on resistance). By adjusting the gate voltage of the linear MOSFETs accordingly, e.g., via a digital-to-analog converter (DAC), a voltage drop can be realized across the linear MOSFETs which is equal to the voltage needed on the DUT. Still other techniques are described herein, such as current limiting techniques for the probe needles of the test equipment.

Figure 1:
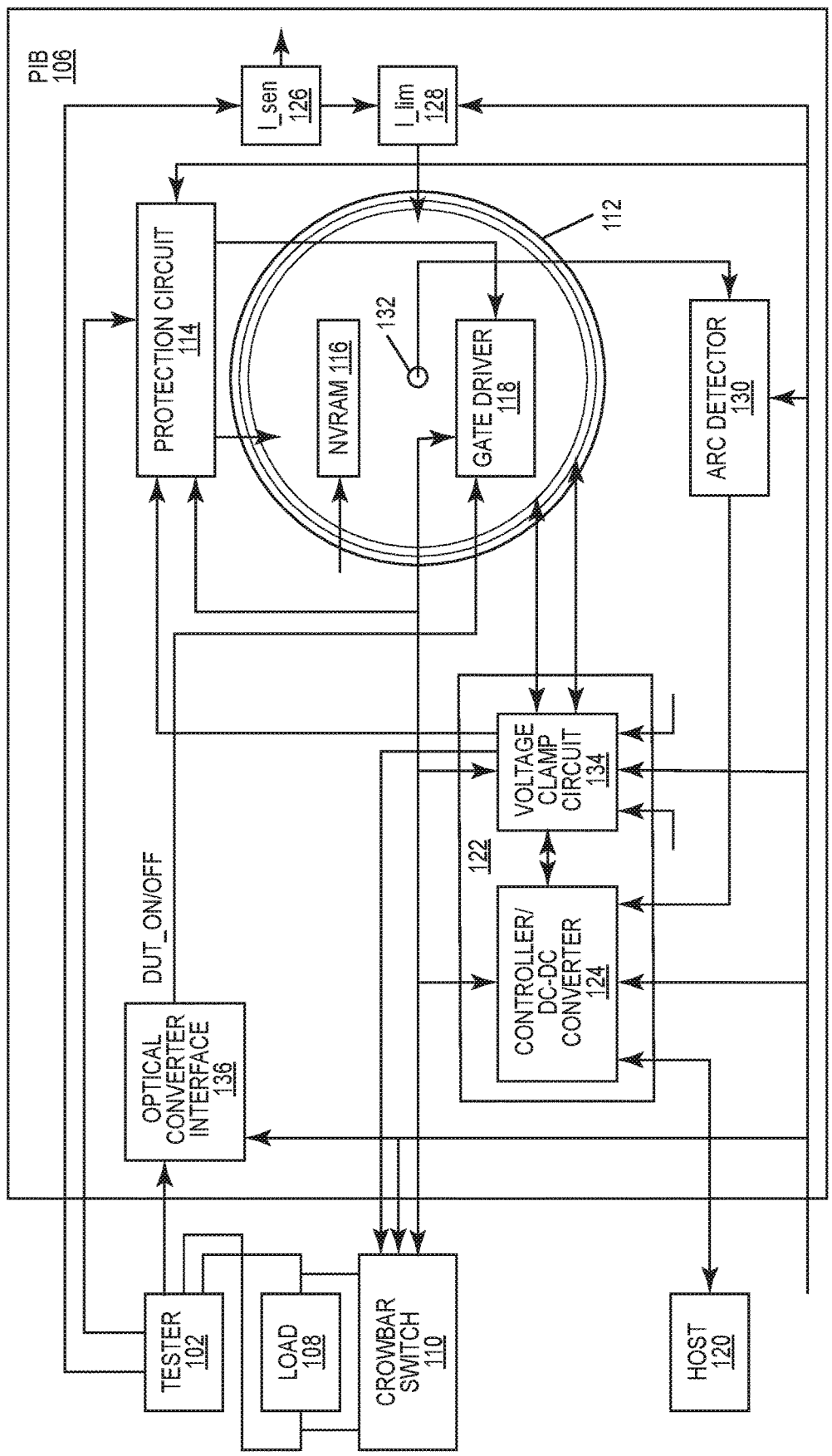
FIG. 1 illustrates a block diagram of an embodiment of an electronic test equipment apparatus for testing power semiconductor devices.

FIG. 1 illustrates an embodiment of an electronic test equipment apparatus 100 for testing power semiconductor devices such as power MOSFETs, IGBTs, HEMTs, SiC FETs, power diodes, etc. The electronic test equipment apparatus 100 includes a tester 102 for implementing one or more test routines and a prober interface board (PIB) 104 for interfacing between the tester 102 and a device-under-test (DUT) and delivering energy and test signals to the DUT during testing. In the case of clamped inductive load testing, the electronic test equipment apparatus 100 also includes an inductive load 108 such as an inductor which is energized by the tester 102, and an optional crowbar switch 110 with Vce peak detection as another trigger for activating energy diversion during DUT testing. Clamped inductive load testing involves evaluating and/or measuring, among other things, the energy dissipated by the DUT at switch-OFF of the inductive load 108.

Applications such as automotive applications drive a large number of actuators such as injectors, relays, valves (purge, intake, etc.) and various solenoids, which have mostly an inductive behavior. Inductive loads like these and other types of inductive loads are typically driven by keeping the inductive load connected to a battery voltage and controlling current flow through a power switch. At the OFF phase of the power switch, the load current decreases to zero and the energy previously stored in the inductive load plus the energy generated by the battery must be dissipated. A small part of this energy is dissipated by the load itself, with the remaining energy causing an increase of the voltage across the power switch. The voltage across the power switch is typically limited by an active clamping circuit.

The electronic test equipment apparatus 100 shown in FIG. 1 may be used to simulate the behavior of an inductive load, for testing whether a power switch device can meet the high voltage and high current switching requirements of an inductive load. If the power switch device under test fails during dynamic switching with high currents and high voltages, the energy of the high current clamped inductive load test must be quickly diverted to prevent catastrophic damage to the test equipment 100 and other devices on the same wafer 112 as the power switch device under test.

To this end, the prober interface board 106 of the electronic test equipment apparatus 100 includes at least one power transistor such as at least one SiC power transistor, at least one IGBT, at least one HEMT, at least one power MOSFET, etc. connected in series between a power terminal for supplying power to a DUT and an interface for the DUT. The power terminal receives power from the inductive load 108 during clamped inductive load testing, and the DUT interface provides power and signalling points of connection to the DUT. The power terminal, DUT, DUT interface and at least one power transistor connected in series between the power terminal and the DUT interface are not shown in FIG. 1 for ease of illustration.

The prober interface board 106 also includes a protection circuit 114 that automatically disconnects the DUT from the power terminal during testing after a predetermined delay, regardless of whether the DUT passes or fails the test routine. During clamped inductive load testing, a gate driver circuit 118 of the prober interface board 106 drives the gate (G) of the DUT responsive to the corresponding control signal from the tester 102. The DUT is switched so as to be subjected to abnormally high voltage and current conditions, thereby accelerating potential reliability defects. For example, during clamped inductive load testing, the DUT may be subjected to voltages and currents which are up to four times (or more) higher than nominal switch-off conditions, e.g., up to four times the current but the voltage is limited to the rated voltage or at least a voltage under the typical breakdown voltage of the DUT. Damage to the test equipment 100 and other devices on the same wafer 112 as the DUT may occur if the DUT is defective, unless the energy of the high current clamped inductive load test is quickly diverted.

Conventional approaches which monitor the collector-emitter voltage (Vce) of a DUT during clamped inductive load testing do not provide fast enough reaction time for safely and reliably diverting the energy of the high current clamped inductive load test in the event of a defective DUT. That is, by the time a problematic Vce is detected and the inductive load is finally disconnected from the DUT, catastrophic damage to the test equipment and other devices may have already occurred.

By instead automatically disconnecting the DUT from the inductive load 108 after a predetermined delay regardless of whether the DUT passes or fails the test routine, the energy of the high current clamped inductive load test is safely and reliably diverted without damaging the test equipment 100 or other devices on the same wafer 112 as the DUT. During testing, the DUT is probed via the DUT interface which is electrically connectable to an inductive energy source 102/108 through the at least one power transistor connected in series between the inductive energy source 102/108 and the DUT interface. The protection circuit 114 switches on the at least one power transistor connected in series between the inductive energy source 102/108 and the DUT interface, to electrically connect the inductive energy source 102/108 to the DUT through the DUT interface as part of a test routine. The protection circuit 114 subsequently and automatically switches off the at least one power transistor connected in series between the inductive energy source 102/108 and the DUT interface after a predetermined delay, to electrically disconnect the inductive energy source 102/108 from the DUT regardless of whether the DUT passes or fails the test routine.

The predetermined delay at which the protection circuit 114 disconnects the inductive energy source 102/108 from the DUT may be programmable, e.g., stored in an EEPROM (electrically erasable programmable read-only memory) or other type of non-volatile memory (NVRAM) 116, so that the electronic test equipment apparatus 100 is compatible with different types of DUTs. In another embodiment, the predetermined delay is implemented by a counter on an FPGA (filed-programmable gate array) in a controller 124 for the prober interface board 106. In yet another embodiment, the predetermined delay is implemented using a function generator with NVRAM 116. Accordingly, the electronic test equipment apparatus 100 may utilize different predetermined delays for testing different types of devices without requiring a redesign or different prober interface board.

The electronic test equipment apparatus 100 may include other components and different types of communications bus systems such as 1-Wire, I²C, RS232, parallel data bus, fiber optic, etc. for facilitating communication between the tester 102 and the prober interface board 106 and between the tester 102 and/or prober interface board 106 and other equipment such as a host computer or server 120. For example, the prober interface board may include a communication board 122 with a controller 124 such as a CPU and a local DC-DC converter. The prober interface board 106 also may include other circuitry such as a current sensor (I_sen) 126, a current limiter (I_lim) 128 for probe needles (not shown in FIG. 1) of the DUT interface, an arc detector 130 for detecting arcing at the wafer 112 with the DUT via an arc sensor 132, a voltage clamp circuit 134 with peak voltage and current detection circuitry, etc. If optical communication is employed between the tester 102 and the prober interface board 106, the prober interface board 106 may include an optical converter interface 136 for facilitating such communication. The communications bus systems of the electronic test equipment apparatus 100 are illustrated by lines with arrows in FIG. 1.

Figure 2:
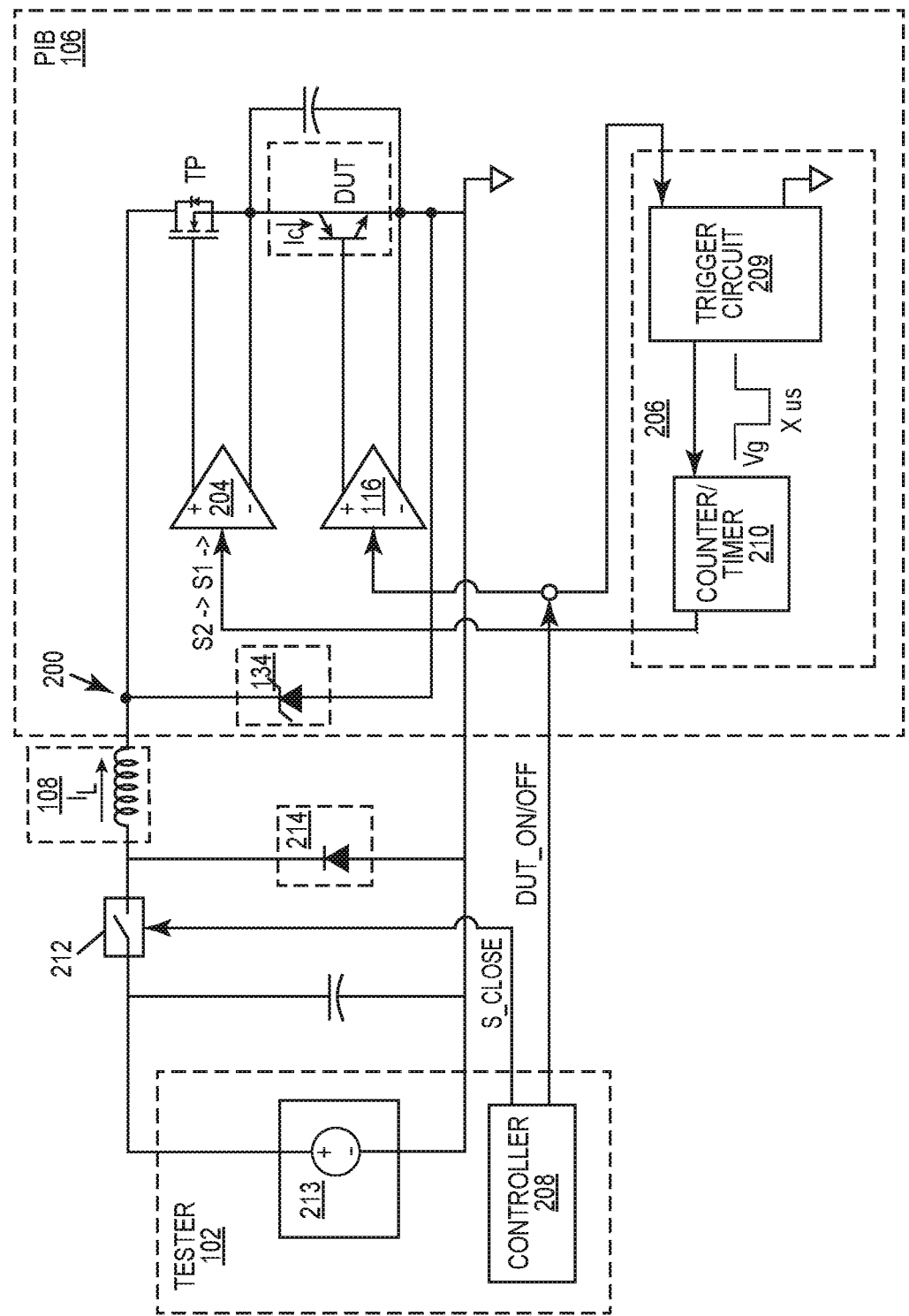
FIG. 2 illustrates a schematic diagram of an embodiment of a protection/energy diversion circuit included in the electronic test equipment apparatus shown in FIG. 1.

FIG. 2 illustrates an embodiment of the protection circuit 114 included in or associated with the prober interface board 106 of the electronic test equipment apparatus 100. At least one power transistor TP is connected in series between a power terminal 200 of the prober interface board 106 and a DUT interface 202 of the prober interface board 106. The at least one power transistor TP may be at least one SiC power transistor, at least one IGBT, at least one HEMT, at least one power MOSFET, etc. In the case of SiC power transistors, SiC is faster than Si and suitable for high voltage and high current conditions. SiC power transistors therefore are particularly effective as energy diversion switches, e.g., in testing of IGBTs. SiC power transistors such as SiC JFETs or SiC MOSFETs, for example, may be used as the at least one power transistor TP. The at least one power transistor TP may include an integrated body diode, as illustrated. In general, any high-voltage transistors may be used in the power path of the electronic test equipment apparatus 100 and programmed with a pre-determined turn off time independent of any feedback/monitoring.

The DUT interface 202 includes probes (not shown) for making electrical contact with a DUT. The DUT is illustrated as an IGBT in FIG. 2 but can be any type of power transistor. In one embodiment, the DUT is part of a semiconductor wafer 112 having a plurality of devices and the DUT interface 202 is configured to probe the semiconductor wafer 112 via the probes.

In FIG. 2, the protection circuit 114 included in or associated with the prober interface board 106 includes a gate driver circuit 204 configured to drive a gate terminal of the at least one power transistor TP. Any type of circuit operable to drive a gate terminal of a power transistor may be used. For example, the gate driver circuit 204 may be an IC gate driver, a Darlington configuration, etc. The protection circuit also includes a controller 206, which may be the same or different controller as the main controller 124 of the prober interface board 106.

The protection circuit controller 206 provides a first logic signal S1 to the gate driver circuit 204 for switching on the at least one power transistor TP and electrically connecting the power terminal 200 of the prober interface board 106 to the DUT as part of a test routine. The protection circuit controller 206 subsequently provides a second logic signal S2 to the gate driver circuit 204 for switching off the at least one power transistor TP after a predetermined delay, so that the power terminal 200 is electrically disconnected from the DUT regardless of whether the DUT passes or fails the test routine.

First logic signal S1 may correspond to a logic high or logic low signal, and the second logic signal S2 may have the opposite signal level. The gate driver circuit 204 may level shift the logic signals S1, S2 to the appropriate voltage level for actuating the gate of the at least one power transistor TP. The signals S1, S2 for controlling the on/off state of the at least one power transistor TP may instead have the proper voltage levels when input to the gate driver circuit 204 for the at least one power transistor TP.

The controller 208 of the tester 102 generates a signal DUT_on/off which controls when the DUT is switched on as part of a test routine. In one embodiment, the start of the predetermined delay is determined or triggered by a gate signal DUT_on/off generated by a controller 208 of the tester 102 and which controls when the DUT is switched on at the beginning of a new test routine. In another embodiment, a fast voltage comparator in the voltage clamp circuit 134 is used to determine the start of the predetermined delay. The voltage comparator method should ensure proper test conditions, prevent wafer damage and reduce part-to-part and lot-to-lot variations.

In case of the DUT_on/off signal generated by the tester controller 208 being a trigger input to the protection circuit controller 206, the protection circuit controller 206 may include a trigger circuit 209 such as a Schmitt trigger for detecting the rising or falling edge of the signal DUT_on/off which controls when the DUT is switched on as part of the test routine. The protection circuit controller 206 may also include a counter or timer circuit 210 programmed to the predetermined delay and responsive to the output of the trigger circuit 209. For example, the trigger circuit 209 may generate a pulse Vg having a duration 'X' in the range of microseconds in response to the rising or falling edge of the DUT_on/off signal. The pulse Vg actuates the counter/timer circuit 210. The output of the counter/timer circuit 210 changes from S1 to S2 after the predetermined delay from when the trigger circuit 209 generated the positive pulse Vg, automatically switching off the at least one power transistor TP and electrically disconnecting the power terminal 200 of the prober interface board 106 from the DUT regardless of whether the DUT passes or fails the test routine.

At the beginning of a clamped inductive load test routine, the tester controller 208 generates a signal S_close which closes a switch device 212 for connecting an energy source 213 of the tester 102 to the inductive load 108.

Figure 3:
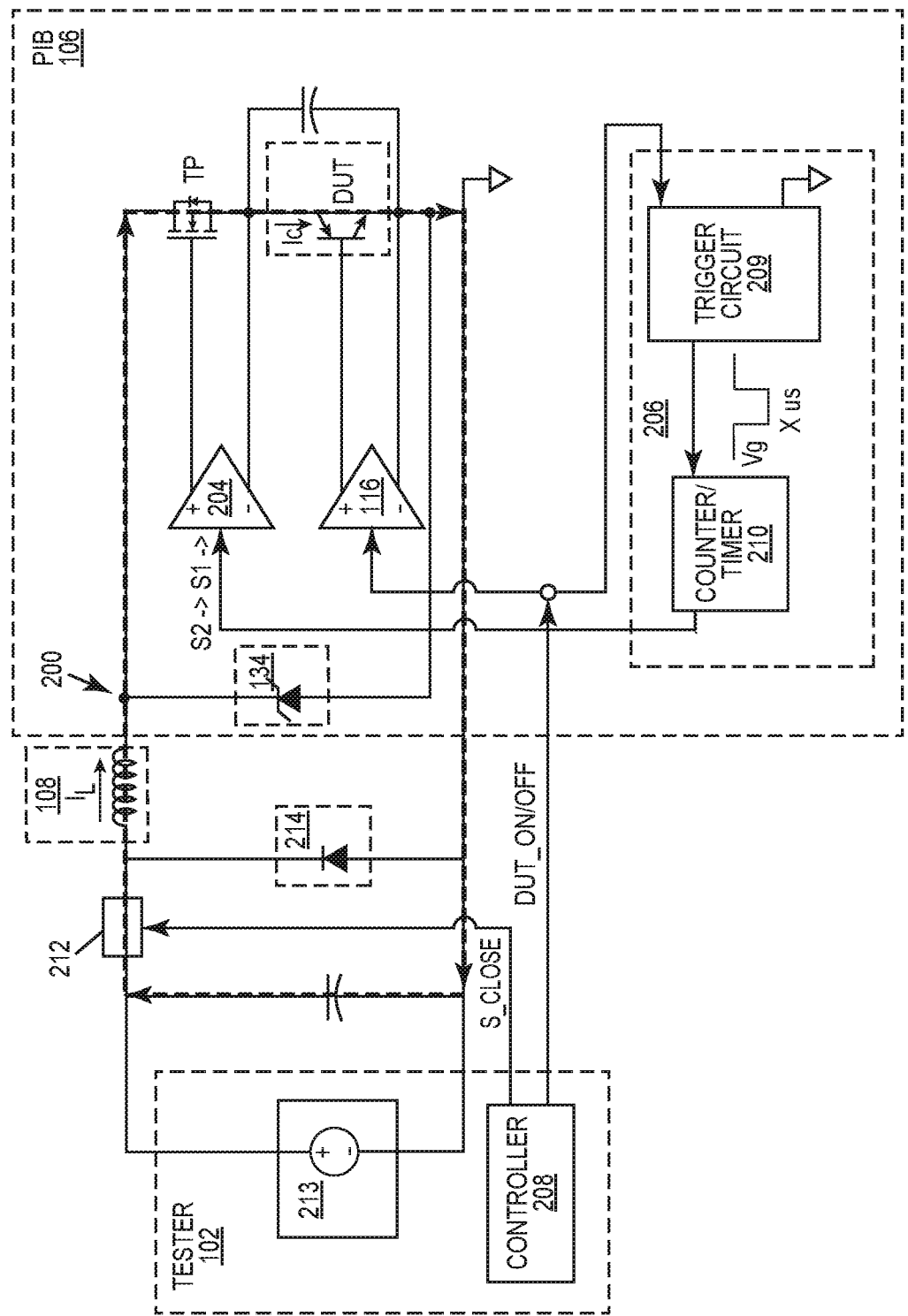
FIGS. 3 through 5 illustrate the current commutation path for the protection/energy diversion circuit shown in FIG. 2 during different stages of operation.

FIG. 3 illustrates the current path on dashed lines with arrows as the inductive load 108 charges. The inductive load current is labelled $I_L$ and can exceed several hundred amps.

Once the inductive load 108 is energized to a sufficient level, which may be programmable for different types of DUTs, the tester controller 208 opens the switch device 212 to disconnect the energy source 213 from the inductive load 108. At this point, the inductive load 108 appears as an inductive energy source to the DUT and the energy stored in the inductive load 108 causes an increase of the voltage across the DUT. The current commutation path is through the DUT and returns through the voltage clamp circuit 134 which is illustrated as a Zener diode implementation in FIG. 2 for ease of illustration.

Figure 4:
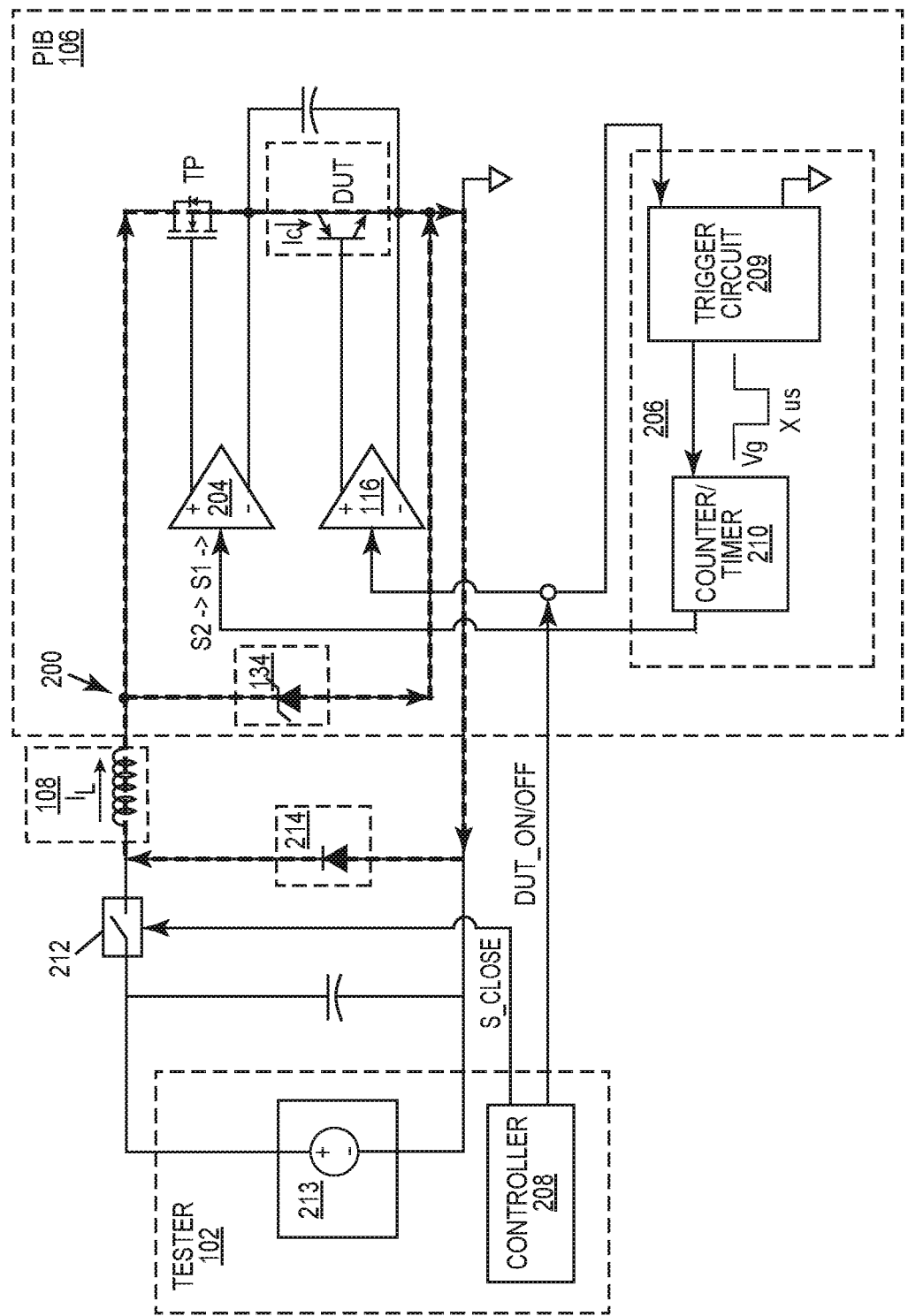

FIG. 4 illustrates the current path after the energy source 213 is disconnected from the inductive load 108 but before the protection circuit controller 206 automatically switches off the at least one power transistor TP connected in series between the power terminal 200 of the prober interface board 106 and the DUT. Current commutates to the DUT and back to the inductive load 108 through a forward-biased diode device 214. As the collector current Ic in the DUT approaches zero, the voltage clamp circuit 134 clamps the voltage across the at least one power transistor TP and the DUT connected in series with the at least one power transistor TP. For example, in the case of a Zener implementation, the voltage clamp circuit 134 enters avalanche and begins to conduct, clamping the voltage across the at least one power transistor TP and the DUT.

Once the predetermined delay expires, the protection circuit controller 206 switches off the at least one power transistor TP connected in series between the power terminal 200 of the prober interface board 106 and the DUT. Doing so automatically disconnects the power terminal 200 from the DUT regardless of whether the DUT passes or fails the test routine. As explained above, this may involve the trigger circuit 209 generating a pulse Vg in response to the rising or falling edge of the signal DUT_on/off which controls when the DUT is switched on as part of the clamped inductive load test routine. The pulse Vg actuates the counter/timer circuit 210 of the protection circuit controller 206, which in turn generates the signal S2 after a predetermined delay programmed into the counter/timer circuit 210 expires. The signal S2 causes the at least one power transistor TP to automatically switch off, thereby electrically disconnecting the power terminal 200 of the prober interface board 106 from the DUT regardless of whether the DUT passes or fails the test routine.

Figure 5:
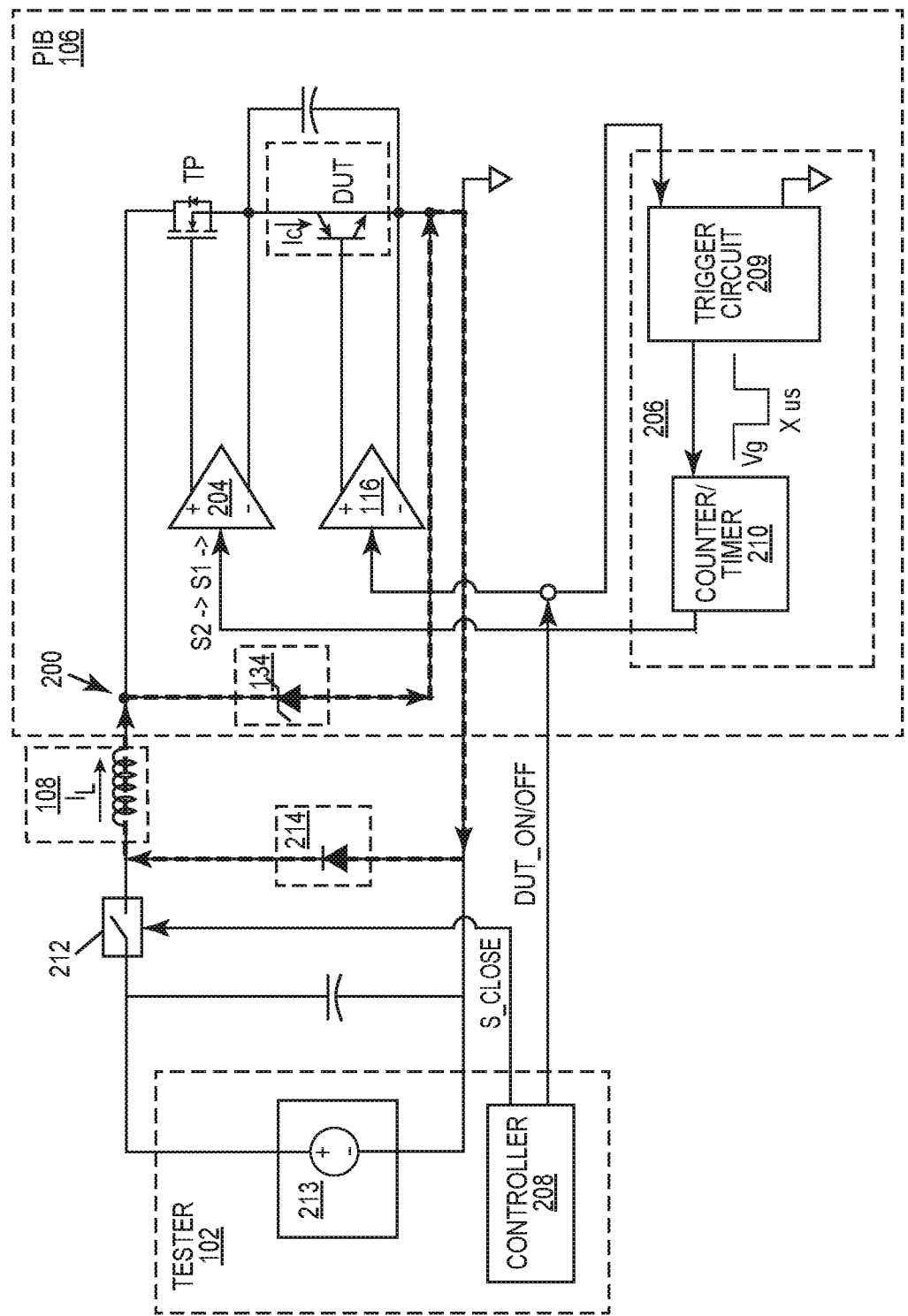

FIG. 5 illustrates the current path after the protection circuit controller 206 switches off the at least one power transistor TP connected in series between the power terminal 200 of the prober interface board 106 and the DUT. The current Ic in the DUT has reached zero and the voltage clamp circuit 134, in the case of a Zener diode implementation, is fully in avalanche. The inductive load current $I_L$ eventually goes to zero.

The current limiter circuit 128 of the electronic test equipment apparatus 100 is configured to limit the current permitted to flow through the probes of the DUT interface 202 during testing, and the voltage clamp circuit 134 is configured to limit the voltage applied to the at least one power transistor TP from the power terminal 200 of the prober interface board 106. Described next are embodiments of the voltage clamp circuit 134, followed by embodiments of the current limiter circuit 128.

The voltage clamp circuit 134 limits the voltage across the DUT during testing. During clamped inductive load testing, the voltage clamp circuit 134 also absorbs energy after the inductive load 108 is disconnected from the tester energy source 213, e.g., as shown in FIGS. 4-5.

Figure 6:
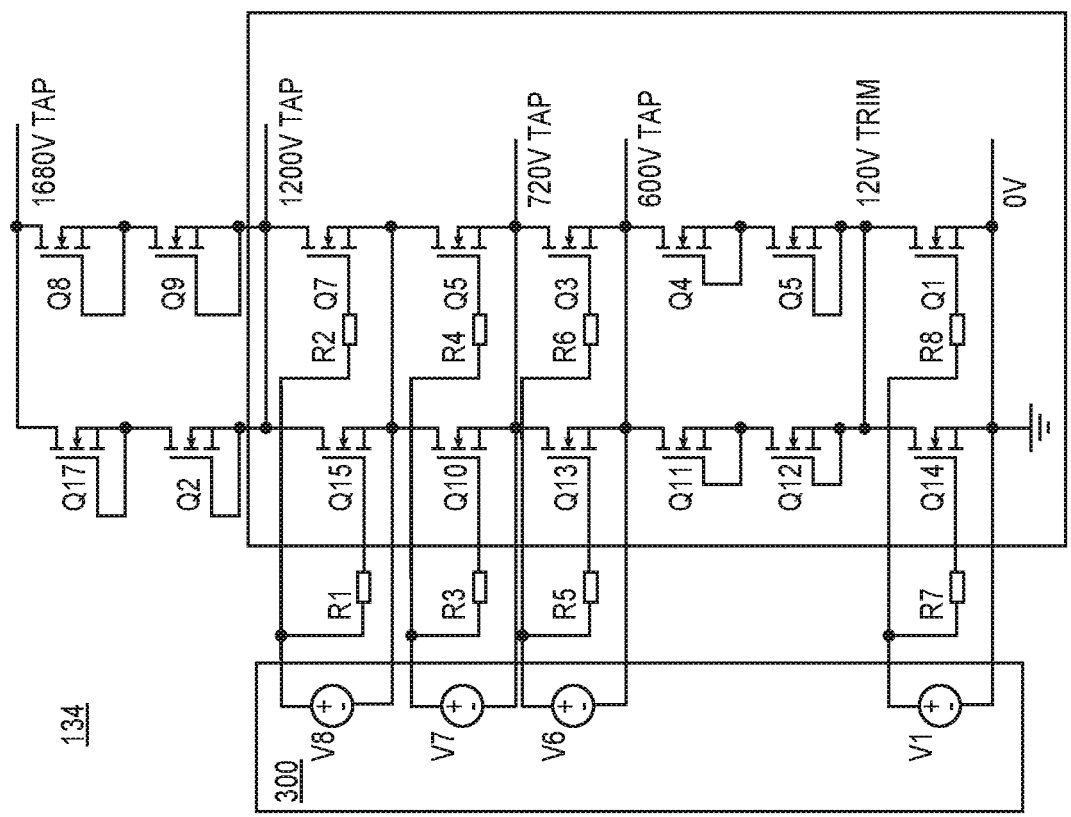
FIG. 6 illustrates a circuit schematic diagram of an embodiment of a voltage clamping circuit included in the electronic test equipment apparatus shown in FIG. 1.

FIG. 6 illustrates an embodiment of the voltage clamp circuit 134 of the electronic test equipment apparatus 100. According to this embodiment, the voltage clamp circuit 134 provides a clamping voltage for the DUT in discrete voltage steps. The voltage clamp circuit 134 includes a plurality of power MOSFETs Q1-Q17 connected in series with different voltage tap points ('XXXV Tap'). Each power MOSFET Q1-Q17 is avalanche-rated and capable of handling energy commutated through the current commutation path shown in FIGS. 3-5 when the at least one power transistor TP connected in series between the power terminal 200 of the prober interface board 106 and the DUT is switched off.

The breakdown voltage of the power MOSFETs Q1-Q17 is used to limit the voltage applied across the DUT during testing. Avalanche-rated power MOSFETs can handle energy being dumped into them after switching off the at least one power transistor TP connected in series between the power terminal 200 of the prober interface board 106 and the DUT is switched off. The power MOSFETs Q1-Q17 have different voltage ratings and the different tap points provide different voltage levels.

The voltage clamp circuit 134 also includes a circuit 300 configured to control which power MOSFETs Q1-Q17 are on and which power MOSFETs Q1-Q17 are off, to provide discrete adjustments via the different tap points to the limit of the voltage applied to the at least one power transistor TP by the voltage clamp circuit 134. The circuit 300 for controlling which power MOSFETs Q1-Q17 are on and which power MOSFETs Q1-Q17 are off is illustrated as voltage sources V1, V5, V7 and V8, since the circuit 300 controls the gate voltage of the power MOSFETs Q1-Q17 accordingly. Voltages V1, V5, V7 and V8 determine or set the voltage of the clamp circuit 134. If one of the power MOSFETs Q1-Q17 is turned on, a small voltage drop occurs across this MOSFTE. If that power MOSFET is turned off, that MOSFET goes into breakdown and increases the breakdown voltage of the clamp circuit 134. The circuit 300 for controlling the power MOSFETs Q1-Q17 may be part of the main controller 123 of the prober interface board 106 or may be a different circuit. In another embodiment, the voltage clamp circuit 134 of the electronic test equipment apparatus 100 includes one or more clamping diodes connected in series, e.g., as schematically illustrated by the Zener diode in FIG. 2.

Figure 7:
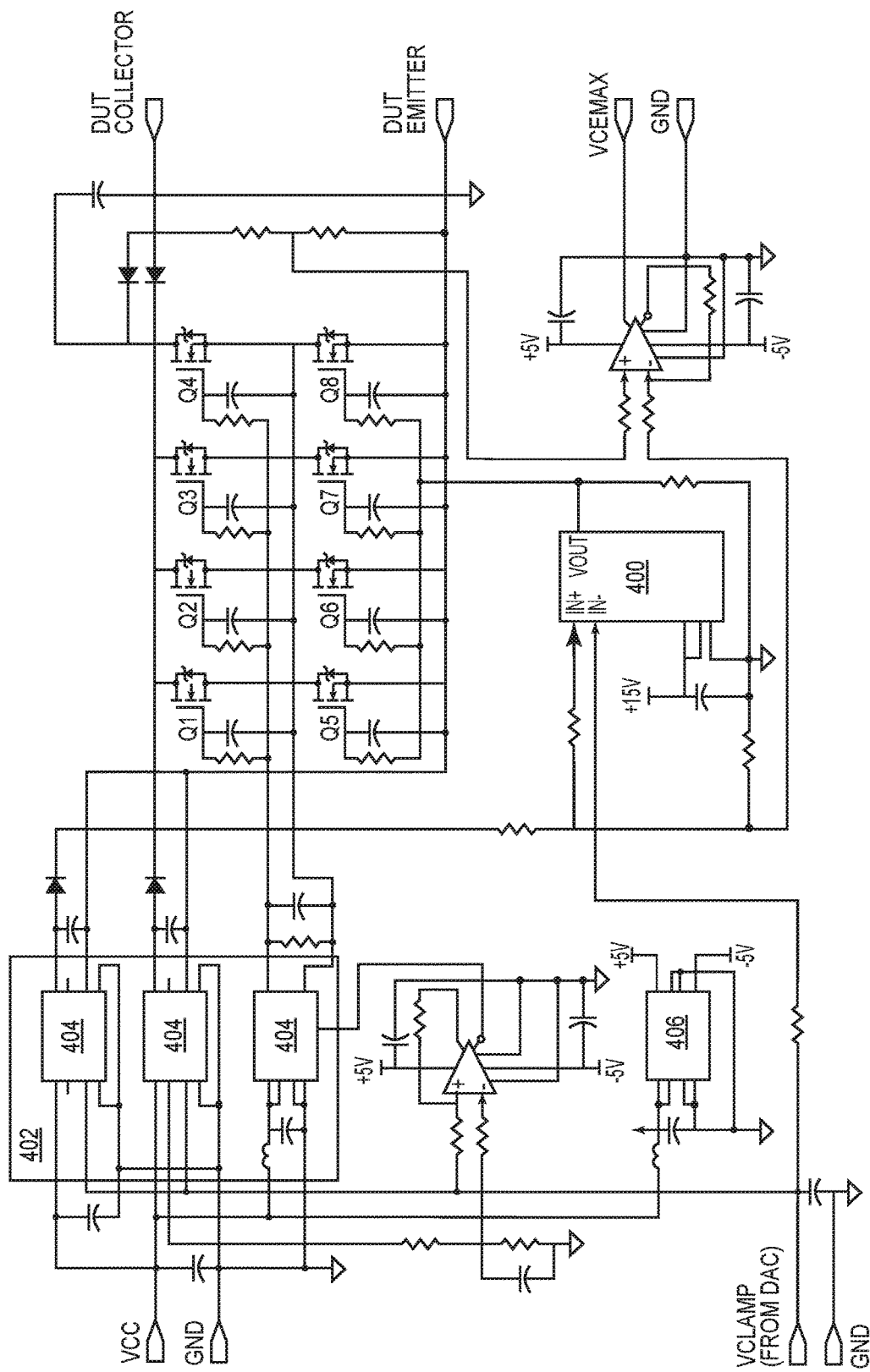
FIG. 7 illustrates a circuit schematic diagram of another embodiment of a voltage clamping circuit included in the electronic test equipment apparatus shown in FIG. 1.

FIG. 7 illustrates another embodiment of the voltage clamp circuit 134 of the electronic test equipment apparatus 100. According to this embodiment, the voltage clamp circuit 134 provides a clamping voltage for the DUT that is continuously variable or nearly continuously variable. The voltage clamp circuit 134 includes a plurality of branches of series-connected linear power MOSFETs Q1-Q8. Each linear power MOSFET Q1-Q8 has a linear or nearly linear relationship between gate voltage and drain-source on resistance (Rdson). The voltage clamp circuit 134 also includes a circuit 400 configured to control which linear power MOSFETs Q1-Q8 are on and which linear power MOSFETs Q1-Q8 are off via a signal VOUT applied to the respective gates of the linear power MOSFETs Q1-Q8, to provide continuous or near continuous adjustments to the voltage clamp limit provided by the clamp circuit 134. The clamped voltage appears across the terminals labelled 'DUT COLLECTOR' and 'DUT EMITTER' in FIG. 7.

In one embodiment, the circuit 400 for controlling the linear MOSFETs Q1-Q8 receives an input VCLAMP from a DAC. The gate voltages of the linear power MOSFETs Q1-Q8 can be adjusted via the signal VOUT in response to the DAC output VCLAMP, to give a voltage drop across the linear power MOSFETs Q1-Q8 which is equal to voltage permitted at the DUT. For example, the DAC output VCLAMP may range from 1V to 5V and have a resolution in the millivolt range. The corresponding voltage clamping range of the voltage clamp circuit 134 may be 196V to 980V, for example.

The voltage clamp circuit 134 also includes a pre-charge power supply 402 having one or more power supplies 404 such as DC/DC converters which helps reduce reaction time, allowing the voltage clamp circuit 134 to react quicker. The pre-charge power supply 402 functions like a linear power supply and is controlled by a voltage regulator 406 such as another DC/DC converter. The voltage clamp circuit 134 shown in FIG. 7 may or may not be used with the fast protection/energy diversion technique implemented by the protection circuit 114 previously described herein. If used in conjunction with the protection circuit 114, the dynamic voltage clamp across the terminals labelled 'COLLECTOR' and 'EMITTER' in FIG. 7 limits the voltage applied across the at least one power transistor TP connected in series with the DUT.

Figure 8:
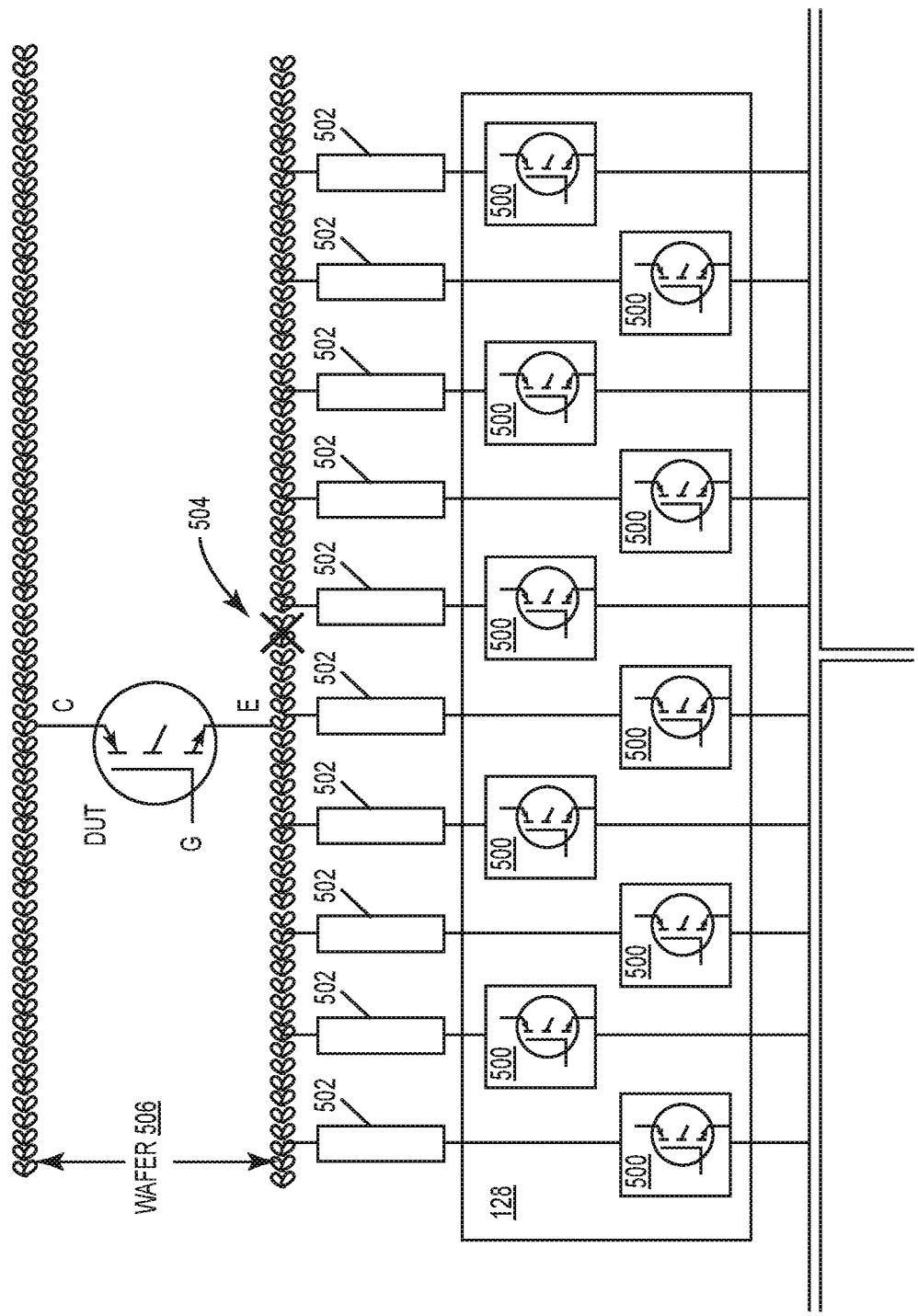
FIG. 8 illustrates a circuit schematic diagram of an embodiment of a current limiter circuit included in the electronic test equipment apparatus shown in FIG. 1.

FIG. 8 illustrates an embodiment of the current limiter circuit 128 of the electronic test equipment apparatus 100. According to this embodiment, the current limiter circuit 128 includes a separate IGBT or power MOSFET 500 electrically connected to each individual probe 502 of the DUT interface 202 of the prober interface board 106. Each separate IGBT/power MOSFET 500 is configured to limit the current permitted to flow through the probe 502 electrically connected to the IGBT/power MOSFET 500 by operating in desaturation.

In case of a localized short 504 occurred on the wafer 506 that includes the DUT being tested, a majority of current would flow through the probe(s) 502 closest to the localized short if the current limiters 500 were not provided. By providing the current limiters 500, the current is limited through each individual probe 502. For example, if the DUT interface 202 of the prober interface board 106 one hundred 100 probes 502 and fifty of the probes 502 were missing, the current limiter circuit 128 would allow only a preselected amount of current onto the fifty available probes 502, thereby providing per-probe protection. By operating each IGBT/power MOSFET 500 in desaturation, the current remains constant at voltage continues to increase, yielding a current limit that is relatively fixed or independent of voltage change. Without the current limiters 500, the majority of current will flow through pin(s) closest to the localized short 504.

Although the present disclosure is not so limited, the following numbered examples demonstrate one or more aspects of the disclosure.

Example 1. An electronic test equipment apparatus, comprising: a power terminal configured to receive power; an interface for a device under test (DUT); at least one power transistor connected in series between the power terminal and the interface for the DUT; and a protection circuit configured to: switch on the at least one power transistor, to electrically connect the power terminal to the DUT through the interface as part of a test routine; and subsequently automatically switch off the at least one power transistor after a predetermined delay, to electrically disconnect the power terminal from the DUT regardless of whether the DUT passes or fails the test routine.

Example 2. The electronic test equipment apparatus of example 1, wherein the protection circuit comprises: a gate driver circuit configured to drive a gate terminal of the at least one power transistor; and a controller configured to: provide a first logic signal to the gate driver circuit for switching on the at least one power transistor, so that the at least one power transistor electrically connects the power terminal to the DUT through the interface as part of the test routine; and subsequently provide a second logic signal to the gate driver circuit for switching off the at least one power transistor after the predetermined delay, so that the at least one power transistor electrically disconnects the power terminal from the DUT regardless of whether the DUT passes or fails the test routine.

Example 3. The electronic test equipment apparatus of example 2, wherein a signal which controls when the DUT turns on as part of the test routine is a trigger input to the controller, and wherein the controller comprises a counter or timer circuit programmed to the predetermined delay and responsive to the trigger input.

Example 4. The electronic test equipment apparatus of any one of examples 1 through 3, wherein the predetermined delay is programmable so that the electronic test equipment apparatus is compatible with different types of DUTs.

Example 5. The electronic test equipment apparatus of any one of examples 1 through 4, wherein the at least one power transistor is a silicon carbide (SiC) power transistor.

Example 6. The electronic test equipment apparatus of any one of examples 1 through 4, wherein the at least one power transistor is an insulated gate bipolar transistor (IGBT).

Example 7. The electronic test equipment apparatus of any one of examples 1 through 6, wherein the interface for the DUT comprises a plurality of probes configured to make electrical contact with the DUT.

Example 8. The electronic test equipment apparatus of example 7, wherein the DUT is part of a semiconductor wafer having a plurality of devices, and wherein the electronic test equipment apparatus is a prober interface board configured to probe the semiconductor wafer via the plurality of probes.

Example 9. The electronic test equipment apparatus of examples 7 or 8, further comprising a current limiter circuit configured to limit the current permitted to flow through the plurality of probes.

Example 10. The electronic test equipment apparatus of example 9, wherein the current limiter circuit comprises a separate IGBT electrically connected to each individual probe of the plurality of probes, each separate IGBT configured to limit the current permitted to flow through the probe electrically connected to the IGBT by operating in desaturation.

Example 11. The electronic test equipment apparatus of any one of examples 1 through 10, further comprising a voltage clamp circuit configured to limit the voltage applied to the at least one power transistor from the power terminal.

Example 12. The electronic test equipment apparatus of example 11, wherein the power terminal is configured to be supplied by an inductive energy source, and wherein the voltage clamp circuit forms part of a current commutation path with the inductive energy source when the at least one power transistor is off.

Example 13. The electronic test equipment apparatus of examples 11 or 12, wherein the voltage clamp circuit comprises one or more clamping diodes connected in series.

Example 14. The electronic test equipment apparatus of examples 11 or 12, wherein the voltage clamp circuit comprises: a plurality of power MOSFETs connected in series with different voltage tap points, each power MOSFET of the plurality of power MOSFETs being avalanche-rated and capable of handling energy commutated through the current commutation path when the at least one power transistor is switched off; and a circuit configured to control which power MOSFETs of the plurality of power MOSFETs are on and which power MOSFETs of the plurality of power MOSFETs are off, to provide discrete adjustments to the limit of the voltage applied to the at least one power transistor by the voltage clamp circuit.

Example 15. The electronic test equipment apparatus of examples 11 or 12, wherein the voltage clamp circuit comprises: a plurality of branches of series-connected linear power MOSFETs, each linear power MOSFET of the plurality of linear power MOSFETs having a linear or nearly linear relationship between gate voltage and drain-source on resistance; and a circuit configured to control which linear power MOSFETs of the plurality of linear power MOSFETs are on and which linear power MOSFETs of the plurality of linear power MOSFETs are off, to provide continuous or near continuous adjustments to the limit of the voltage applied to the at least one power transistor by the voltage clamp circuit.

Example 16. A voltage clamp circuit for electronic test equipment, the voltage clamp circuit comprising: a plurality of branches of series-connected linear power MOSFETs, each linear power MOSFET of the plurality of linear power MOSFETs having a linear or nearly linear relationship between gate voltage and drain-source on resistance; and a circuit configured to control which linear power MOSFETs of the plurality of linear power MOSFETs are on and which linear power MOSFETs of the plurality of linear power MOSFETs are off, to provide continuous or near continuous adjustments to a voltage limited by the voltage clamp circuit.

Example 17. A method of testing a device under test (DUT), the method comprising: probing the DUT via a DUT interface, the DUT interface being electrically connectable to an energy source through at least one power transistor connected in series between the energy source and the DUT interface; switching on the at least one power transistor, to electrically connect the energy source to the DUT through the DUT interface as part of a test routine; and subsequently automatically switching off the at least one power transistor after a predetermined delay, to electrically disconnect the energy source from the DUT regardless of whether the DUT passes or fails the test routine.

Example 18. The method of example 17, further comprising: limiting the current permitted to flow to the DUT through a plurality of probes of the DUT interface, by operating a separate IGBT electrically connected to each individual probe of the plurality of probes in desaturation.

Example 19. The method of examples 17 or 18, further comprising: limiting the voltage applied to the at least one power transistor from the energy source, by controlling a plurality of avalanche-rated power MOSFETs connected in series with different voltage tap points, by controlling which power MOSFETs of the plurality of power MOSFETs are on and which power MOSFETs of the plurality of power MOSFETs are off, thereby providing discrete adjustments to the limit of the voltage applied to the at least one power transistor.

Example 20. The method of examples 17 or 18, further comprising: limiting the voltage applied to the at least one power transistor from the energy source, by controlling a plurality of branches of series-connected linear power MOSFETs having a linear or nearly linear relationship between gate voltage and drain-source on resistance, by controlling which linear power MOSFETs of the plurality of linear power MOSFETs are on and which linear power MOSFETs of the plurality of linear power MOSFETs are off, thereby providing continuous or near continuous adjustments to the limit of the voltage applied to the at least one power transistor.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic test equipment apparatus, comprising:
a power terminal configured to receive power;
an interface for a device under test (DUT);
at least one power transistor connected in series between the power terminal and the interface for the DUT; and
a protection circuit configured to:
switch on the at least one power transistor, to electrically connect the power terminal to the DUT through the interface as part of a test routine; and
subsequently automatically switch off the at least one power transistor after a predetermined delay, to electrically disconnect the power terminal from the DUT regardless of whether the DUT passes or fails the test routine.

2. The electronic test equipment apparatus of claim 1, wherein the protection circuit comprises:
a gate driver circuit configured to drive a gate terminal of the at least one power transistor; and
a controller configured to:
provide a first logic signal to the gate driver circuit for switching on the at least one power transistor, so that the at least one power transistor electrically connects the power terminal to the DUT through the interface as part of the test routine; and
subsequently provide a second logic signal to the gate driver circuit for switching off the at least one power transistor after the predetermined delay, so that the at least one power transistor electrically disconnects the power terminal from the DUT regardless of whether the DUT passes or fails the test routine.

3. The electronic test equipment apparatus of claim 2, wherein a signal which controls when the DUT turns on as part of the test routine is a trigger input to the controller, and wherein the controller comprises a counter or timer circuit programmed to the predetermined delay and responsive to the trigger input.

4. The electronic test equipment apparatus of claim 1, wherein the predetermined delay is programmable so that the electronic test equipment apparatus is compatible with different types of DUTs.

5. The electronic test equipment apparatus of claim 1, wherein the at least one power transistor is a silicon carbide (SiC) power transistor.

6. The electronic test equipment apparatus of claim 1, wherein the at least one power transistor is an insulated gate bipolar transistor (IGBT).

7. The electronic test equipment apparatus of claim 1, wherein the interface for the DUT comprises a plurality of probes configured to make electrical contact with the DUT.

8. The electronic test equipment apparatus of claim 7, wherein the DUT is part of a semiconductor wafer having a plurality of devices, and wherein the electronic test equipment apparatus is a prober interface board configured to probe the semiconductor wafer via the plurality of probes.

9. The electronic test equipment apparatus of claim 7, further comprising a current limiter circuit configured to limit a current permitted to flow through the plurality of probes.

10. The electronic test equipment apparatus of claim 9, wherein the current limiter circuit comprises a separate IGBT electrically connected to each individual probe of the plurality of probes, each separate IGBT configured to limit the current permitted to flow through the probe electrically connected to the IGBT by operating in desaturation.

11. The electronic test equipment apparatus of claim 1, further comprising a voltage clamp circuit configured to limit a voltage applied to the at least one power transistor from the power terminal.

12. The electronic test equipment apparatus of claim 11, wherein the power terminal is configured to be supplied by an inductive energy source, and wherein the voltage clamp circuit forms part of a current commutation path with the inductive energy source when the at least one power transistor is off.

13. The electronic test equipment apparatus of claim 11, wherein the voltage clamp circuit comprises one or more clamping diodes connected in series.

14. The electronic test equipment apparatus of claim 11, wherein the voltage clamp circuit comprises:
a plurality of power MOSFETs connected in series with different voltage tap points, each power MOSFET of the plurality of power MOSFETs being avalanche-rated and capable of handling energy commutated through a current commutation path when the at least one power transistor is switched off; and
a circuit configured to control which power MOSFETs of the plurality of power MOSFETs are on and which power MOSFET of the plurality of power MOSFETs are off, to provide discrete adjustments to the limit of the voltage applied to the at least one power transistor by the voltage clamp circuit.

15. The electronic test equipment apparatus of claim 11, wherein the voltage clamp circuit comprises:
a plurality of branches of series-connected linear power MOSFETs, each linear power MOSFET of the plurality of linear power MOSFETs having a linear relationship between gate voltage and drain-source on resistance; and
a circuit configured to control which linear power MOSFETs of the plurality of linear power MOSFETs are on and which linear power MOSFET of the plurality of linear power MOSFETs are off, to provide continuous adjustments to the limit of the voltage applied to the at least one power transistor by the voltage clamp circuit.

16. A voltage clamp circuit for electronic test equipment, the voltage clamp circuit comprising:
a plurality of branches of series-connected linear power MOSFETs, each linear power MOSFET of the plurality of linear power MOSFETs having a linear relationship between gate voltage and drain-source on resistance; and
a circuit configured to control which linear power MOSFETs of the plurality of linear power MOSFETs are on and which linear power MOSFET of the plurality of linear power MOSFETs are off, to provide continuous adjustments to a voltage limited by the voltage clamp circuit.

17. A method of testing a device under test (DUT), the method comprising:
probing the DUT via a DUT interface, the DUT interface being electrically connectable to an energy source through at least one power transistor connected in series between the energy source and the DUT interface;
switching on the at least one power transistor, to electrically connect the energy source to the DUT through the DUT interface as part of a test routine; and
subsequently automatically switching off the at least one power transistor after a predetermined delay, to electrically disconnect the energy source from the DUT regardless of whether the DUT passes or fails the test routine.

18. The method of claim 17, further comprising:
limiting a current permitted to flow to the DUT through a plurality of probes of the DUT interface, by operating a separate IGBT electrically connected to each individual probe of the plurality of probes in desaturation.

19. The method of claim 17, further comprising:
limiting a voltage applied to the at least one power transistor from the energy source, by controlling a plurality of avalanche-rated power MOSFETs connected in series with different voltage tap points, by controlling which power MOSFETs of the plurality of power MOSFETs are on and which power MOSFET of the plurality of power MOSFETs are off, thereby providing discrete adjustments to a limit of the voltage applied to the at least one power transistor.

20. The method of claim 17, further comprising:
limiting the voltage applied to the at least one power transistor from the energy source, by controlling a plurality of branches of series-connected linear power MOSFETs having a linear relationship between gate voltage and drain-source on resistance, by controlling which linear power MOSFETs of the plurality of linear power MOSFETs are on and which linear power MOSFET of the plurality of linear power MOSFETs are off, thereby providing continuous adjustments to the limit of the voltage applied to the at least one power transistor.

* * * * *